United States Patent [19]

Arai et al.

[11] Patent Number: 5,198,285

[45] Date of Patent: Mar. 30, 1993

[54] HARD AND LUBRICANT THIN FILM OF IRON BASE METALLIC MATERIAL COATED WITH AMORPHOUS CARBON-HYDROGEN-SILICON

[75] Inventors: Tohru Arai; Kazuyuki Oguri, both of Aichi, Japan

[73] Assignee: Kabushiki Kaisha Toyota Chuo Kenkyusho, Aichi, Japan

[21] Appl. No.: 634,506

[22] Filed: Dec. 27, 1990

[30] Foreign Application Priority Data

Dec. 28, 1989 [JP] Japan .................. 1-340858
Dec. 28, 1989 [JP] Japan .................. 1-340860
Sep. 7, 1990 [JP] Japan .................. 2-237767

[51] Int. Cl.$^5$ .................. B32B 9/00; C23C 16/26
[52] U.S. Cl. .................. 428/216; 428/408; 428/457; 428/693
[58] Field of Search .............. 428/408, 693, 457, 215, 428/216

[56] References Cited

U.S. PATENT DOCUMENTS 4,525,417 6/1985 DiMigen et al. .................. 428/457

OTHER PUBLICATIONS

Patent Abstracts of Japan, vol. 13, No. 134, (C-581) [3482], 4 Apr. 1989; & JP-A-63 297 208 (NEC Corp.) Dec. 1988.
Patent Abstracts of Japan, vol. 12, No. 438 (C-544) [3285], 17 Nov. 1988; & AP-A-63 162 871 (NEC Corp.) Jul. 1988.
Chemical Abstracts, vol. 112, No. 12, 19 Mar. 1990, p. 250, abstract no. 102680v, Columbus, OH., U.S.; K. Oguri et al.: "Hard amorphous carbon-silicon coatings by plasma-assisted chemical vapor deposition", & Proc. Jpn. Symp. Plasma Chem. 1989, 2, 197-202.
Journal of Material Research, vol. 5, No. 11, Nov., 1990, pp. 2567-2571; K. Oguri et al.: "Low friction coatings of diamond-like carbon with silicon prepared by plasma-assisted chemical vapor deposition".

*Primary Examiner*—P. C. Sluby
*Attorney, Agent, or Firm*—Oblon, Spivak, McClelland, Maier & Neustadt

[57] ABSTRACT

A hard and lubricant thin film of amorphous carbon-hydrogen-silicon and a process of producing the same. The thin film comprises carbon and hydrogen as major components, the balance mainly containing a silicon-based material, and it contains diamond-like carbon. The content of hydrogen is from 30 to 50% by atomic and the content of carbon is 70% by atomic or more with respect to the total composition except hydrogen.

An iron-based metallic material having the thin film of amorphous carbon-hydrogen-silicon formed thereon and a process for producing the same are also provided. The iron-based matallic material is very hard and has a small coefficient of friction.

4 Claims, 6 Drawing Sheets

HARD AND LUBRICANT THIN FILM OF IRON BASE METALLIC MATERIAL COATED WITH AMORPHOUS CARBON-HYDROGEN-SILICON

BACKGROUND OF THE INVENTION

1. Field of the Invention

The present invention relates to a hard amorphous thin film coating (sometimes referred to as simply "coating" or "thin film" hereinafter) having lubricity, to an iron-base metallic material having on the surface thereof a hard coating of low friction, and to a process for producing the same. More specifically, it relates to a hard thin film coating of amorphous carbon-hydrogen-silicon, which is hard and particularly low in friction coefficient. It also relates to an iron-base metallic material having on the surface thereof a lubricant amorphous carbon-hydrogen-silicon, and to a process for producing the same.

2. Description of the Related Art

Forming hard coatings of metal carbides and metal nitrides such as vanadium carbide (VC), titanium carbide (TiC), and titanium nitride (TiN) on the surface of iron base materials used as tools and metal molds by salt bath immersion method, chemical vapor deposition(CVD), physical vapor deposition (PVD) and the like, is well known. It is practiced in the art of forming thin films and surface-treating iron base materials with the purpose to improve resistances against abrasion and seizure. Those coatings generally are hard and have a Vicker's hardness, Hv, of from 2,000 to 3,000, however, the coatings themselves are not lubricant and the friction coefficient thereof is not so low (from about 0.2 to 0.8, in friction against steel, without applying a lubricant). Accordingly, the sliding resistance in the presence of a counter material increases and causes wear loss to occur on the surface of the coating on one hand, while induces damage on the surface of the counter material on the other. This has therefore constituted a problem yet to be solved.

Concerning lubricant thin film coatings, there is also known thin films of amorphous carbon produced by a process such as plasma-assisted decomposition of hydrocarbon gases. This type of thin film possesses a friction coefficient as low as 0.01, and therefore its practical application to sliding members appears promising. Such favorable amorphous carbon films are, however, structurally unstable, and their tribological properties are subject to atmospheric conditions under which the films are being used. More specifically, it has been a problem in such films that they easily increase their friction coefficient to a high 0.2 in case of using them in air.

There is proposed, accordingly, a measure to solve the aforementioned problems, which comprises incorporating additional metals to carbon coatings to thereby stably obtain a friction coefficient of 0.1 or lower against steel in ambient atmosphere (U.S. Pat. No. 4,525,417). It is reported that a low friction coefficient of 0.07 is obtained in carbon films containing from 5 to 20% by atomic of silicon, however, a value as low as 0.05 or less, e.g., 0.03 and 0.04, has not yet achieved.

A friction coefficient of 0.1 or lower is indeed a low value if compared as an absolute value, but considering reducing the value from 0.07 to 0.03, it can be easily realized that the coefficient is halved, and therefore the reacting force incorporated therein is also reduced to a half. It is therefore, a great matter concerning the practical application of lubricant films. In the aforementioned process, anyhow, it was not possible to obtain a film having a friction coefficient as low as 0.05 or less.

It has been recently reported a method of forming a diamond-like hard carbon coating having an Hv as high as 10000. This film is therefore excellent if only hardness is to be concerned. On the other hand, the film is so hard that it requires a very smooth surface, since any irregularity on the surface can easily damage the counter material, and this in turn has become a problem. It is not possible in the state of art to form a smooth and uniform film, nor is easily obtained a smooth surface by post treatment of the film such as polishing. Accordingly, practical application of those films to sliding members has been a problem of those films. It is also a problem of those films that they can achieve a friction coefficient of 0.1 even on smooth surfaces at best, which is a value one order higher as compared with those of amorphous carbon films.

It is further reported a process for forming amorphous silicon carbide films. Such films have a hardness Hv of about 2,000 and a low friction coefficient of about 0.1, but it is also reported that those properties are easily impaired with deviation in the composition of the film from a stoichiometric value (See Thin Solid Films, Vol. 139(1986), p.275, and Japanese Patent Publication (unexamined) No. 184681/1985).

There further is known a method which comprises applying solid lubricants such as molybdenum sulfide ($MoS_2$) and graphite to thereby improve lubricating properties. Such method may yield a low friction coefficient of 0.05 or lower depending on conditions, however, it also had a problem concerning its durability, since the coated layer is apt to fall off or to be abraded in its use for a long period of time.

Furthermore, aforementioned carbon-based films and silicon carbide films suffered low adhesibility with iron-based materials.

SUMMARY OF THE INVENTION

In the light of aforementioned circumstances, the present inventors intensively and extensively conducted studies and systematically performed experiments to solve the problems associated with the prior art, and as a result achieved the present invention.

An object of the present invention is, therefore, to provide a hard thin film of carbon-hydrogen-silicon film having high hardness and a considerably low friction coefficient.

The present inventors, in the light of the aforementioned problems of the prior art processes, have noted points as follows:

First of all, the coating should be based on carbon to obtain a hard coating low in friction coefficient. This is based on the reported fact that the carbon-based film can on one hand yield a hard film if it is diamond(-like) and a lubricant film on the other if it is based on graphite or an amorphous carbon. It is not possible, however, to obtain satisfactorily a carbon- based coating by applying a prior art process for forming an amorphous carbon film, which comprises simply a process of low temperature plasma decomposition of carbon gas. Furthermore, the carbon-based coating thus obtained is not sufficiently hard and can only yield a low Hv of 1000. Accordingly, it was attempted to modify the process in such a way that the compositional system of the coating be such containing silicon, so that the film formation may be accelerated even under a condition in which carbon singly would not fully develop into a film and that the film thus obtained be sufficiently hard. Furthermore, the composition of the film as well as the bonding state of carbon were carefully controlled, since it is believed that the friction coefficient of the coating depend on the carbon content, bonding state of the carbon, and the hydrogen content as well. As a result, a hard amorphous coating low in friction coefficient composed of carbon-hydrogen-silicon which contains diamond-like carbon has been obtained, which comprises both advantages, i.e. lubricity attributed to amorphous carbon (in this case, diamond-like carbon), and hardness characteristic of diamond-like carbon and silicon carbide.

The hard and lubricant thin film of amorphous carbon-hydrogen-silicon according to the present invention is characterized by that it is an amorphous thin film comprising carbon and hydrogen as the major components and contains a diamond-like carbon, which comprises from 30 to 50% by atomic of hydrogen and the rest comprising 70% by atomic or more of carbon, with the rest comprising silicon-based material as the major component.

The hard thin film of amorphous carbon-hydrogen-silicon according to the present invention has a high hardness and an extremely low friction coefficient.

It is not sufficiently made clear why the hard thin film of amorphous carbon-hydrogen-silicon according to the present invention exerts such favorable effects, but the possible mechanism may be explained as follows.

That is, in the surface layer of the hard thin film of amorphous carbon-hydrogen-silicon according to the present invention, both the diamond-like material in the amorphous carbon and the silicon carbide formed from silicon with carbon contribute to the formation of a surface layer high in hardness. Further concerning the low friction, diamond-like material itself has a low friction coefficient of from about 0.1 to 0.2, and this is further lowered by the formation of silicon oxide ($SiO_2$) ascribed to the so-called "lubricity ascribed to contamination". That is, $SiO_2$ was detected on the surface of the steel against which the thin film according to the present invention was applied for a friction and wear test, and combining this fact with the known effect of an $SiO_2$ thin film on lowering friction coefficient to a relatively low value of about 0.2 by adsorbing gas or the like, it can be concluded that the synergetic effect of both leads to decreasing friction coefficient to a low value of 0.05 or less. In such circumstances, hydrogen further contributes to the lowering of friction coefficient, by being incorporated in the formation of the surface $SiO_2$ as well as in the adsorption of a gas. The hard thin film of amorphous carbon-hydrogen-silicon of the present invention is realized accordingly, which is characterized by its high hardness and an extremely low friction coefficient.

DETAILED DESCRIPTION OF THE INVENTION

The hard and lubricant thin film of amorphous carbon-hydrogen-silicon according to the present invention is characterized by that it possesses a high hardness and a low friction coefficient of 0.05 or less, and by that it is an amorphous thin film comprising carbon and hydrogen as the major components and contains a diamond-like carbon, wherein the amorphous thin film comprises from 30 to 50% by atomic of hydrogen and the rest comprises 70% by atomic or more of carbon with the rest comprising a silicon-based material as the major component.

The amorphous thin film according to the present invention should comprise 70% by atomic or more of carbon with respect to the total composition exclusive of hydrogen, to thereby obtain a low friction layer wherein a sufficient amount of diamond-like carbon is formed in the coating, which makes it possible to achieve a friction coefficient as low as 0.05 or less. It should be noted that this coating layer, though it is a hard layer with an Hv of 2000 or higher, remains high in friction coefficient if the carbon content with respect to the total composition exclusive of hydrogen is lowered to from 50% to 60% by atomic, yielding a value of from 0.4 to 0.5, which is comparable to that of a sintered SiC. With increase in carbon content to over 60% by atomic, diamond-like carbon is also increased in, accompanied by abrupt drop in the friction coefficient.

It is preferred that the amorphous thin film according to the present invention preferably contains from 75% to 90% by atomic of carbon with respect to the total composition except hydrogen. With a carbon content of 75% by atomic or higher, a layer having not only a low friction coefficient of about 0.03, but also an extremely low initial friction is obtained. With a carbon content of over 90% by atomic, i.e., with a silicon content of less than 10% by atomic, however, the resulting film is less hard and is increased in friction coefficient due to the reduced effect on accelerating diamond formation, which in turn tends to increase the friction coefficient. Furthermore, the formation of the aforementioned $SiO_2$ is also reduced that the lubricating effect is further lowered.

Hydrogen content of the hard thin film of amorphous carbon-hydrogen-silicon of the present invention was confirmed to be in the range of from 30 to 50% by atomic by methods such as combustion analysis. This hard thin film having a low friction coefficient of about 0.05 was heated in vacuum at 600° C. for 1 hour to remove hydrogen, to see increase in the friction coefficient to about 0.1, thus confirming the contribution of hydrogen in improving lubricity.

The hard thin film of amorphous carbon-hydrogen-silicon of the present invention comprises a diamond-like carbon having a characteristic structure as seen in its laser Raman spectra yielding a broad Raman band at ca. 1550 cm$^{-1}$ with a shoulder band at ca. 1400 cm$^{-1}$.

It is preferred that the hard thin film of amorphous carbon-hydrogen-silicon according to the present invention has a thickness of from about 0.5 to 10 μm. If it is less than 0.5 μm in thickness, the advantageous properties as a surface coating layer is not fully exhibited; if it exceeds 10 μm in thickness, on the other hand, unfavorable peeling off or the like occurs. The film layer may contain chlorine (Cl), so far as it does not impair the effects intended in the present invention. The amorphous thin film is very smooth on the surface, and in case it is deposited on a base, the resulting thin film almost faithfully reflects the surface roughness of the underlying base.

The hard thin film of amorphous carbon-hydrogen-silicon according to the present invention has an extremely low friction coefficient of 0.05 or less, and can therefore suitably applied to sliding members where lubricant cannot be applied. Its superiority in hardness also makes it suitable to applications such as tools and metal molds to which conventional hard-facing treatments or coatings had been applied. Furthermore, its excellent corrosion resistance and low reactivity and wettability enables its application to appropriate uses where such properties are required.

Now the process for producting the hard and lubricant thin film of amorphous carbon-hydrogen-silicon according to the present invention is shown below referring to a specific embodiment.

First, the object to be coated is placed in a vacuum vessel for use in the plasma-assisted CVD to which a gas mixture comprising a gaseous silicon compound and a gaseous carbon compound as the major components is introduced, and by discharge in the specially prepared gas atmosphere for film deposition, a hard and lubricant thin film of amorphous carbon-hydrogen-silicon according to the present invention is obtained on the surface of the object as desired.

In the aforementioned process for forming the hard and lubricant amorphous film according to the present invention, the object to be coated is first placed on the table provided in the vacuum vessel, and the inside of the vessel is evacuated to remove the remaining gas, to a vacuum of, for example, $1 \times 10^{-4}$ Torr or lower.

Then, under continuous evacuation, heating gas such as hydrogen (H$_2$) is introduced and the discharge affected is using, for example, direct current (dc), high frequency, or the like, so that the temperature of the object to be coated be elevated to a predetermined temperature by the plasma energy. Preferably, the object to be coated is heated to about 500° C. from the viewpoint of reducing unfavorable impurities such as chlorine (Cl), to thereby obtain a surface coating having a favorable film quality not deteriorated by impurities.

Discharge is then effected in a specially prepared gas atmosphere for film deposition comprising a gaseous silicon compound and a gaseous carbon compound as the major components, so that the amorphous thin film coating may be deposited and grown on the surface of the object. The specially prepared gas for use in this process comprises an atmospheric gas and a reactive gas. The latter serves as the starting material for the film. The atmospheric gas may be the commonly used gases such as hydrogen (Hz) and argon (Ar), and the reactive gas may be gases of silicon compounds, gases of carbon compounds, and hydrogen. The gases of silicon compounds may be those of silicon tetrachloride (SiCl$_4$), silicon tetrafluoride (SiF$_4$), trichlorosilicon (SiHCl$_3$), and tetramethylsilicon [TMS, Si(CH$_3$)$_4$]. The gases of carbon compounds may be methane (CH$_4$) and other hydrocarbon gases (C$_m$H$_n$). The composition of the specially prepared gas for film deposition is properly determined depending on the starting gas, deposition temperature, and other conditions, and the total flow rate of the gas is selected taking balance between the volume of the vacuum vessel and the amount of exhaust gas. A representative gas composition using SiCl$_4$ as the gaseous silicon compound and CH$_4$ as the gaseous carbon compound is, by flow ratio taking the amount of SiCl$_4$ as a unit, from 5 to 50 of CH$_4$, from 50 to 500 of H$_2$, and from 30 to 300 of Ar. In cases wherein decomposition of the gaseous carbon compounds is more accelerated by the incorporation of more reactive gaseous carbon compounds such as acetylene (C$_2$H$_2$), or by the application of a higher deposition temperature or plasma energy, the amount of the gaseous carbon compound relative to that of the gaseous silicon compound can be reduced. Further it is possible to control the hydrogen content of the coating film by varying the flow rate of hydrogen gases.

It is preferred in the process according to the present invention to control the pressure of the vacuum vessel in the range of from $10^{-2}$ to 10 Torr. Particularly preferred in the dc discharge process is to control the pressure in the range of from $10^{-1}$ to 10 Torr, and in the high frequency discharge process is preferred to control the pressure in the range of from $10^{-2}$ to 10 Torr. If the pressure is selected from the range out of that aforementioned, the discharge becomes unstable and therefore not preferred.

Thus, the hard thin film of amorphous carbon-hydrogen-silicon having an extremely low friction coefficient according to the present invention can be readily obtained following the process set forth above.

Concerning the mechanism of the effect exhibited by the hard and lubricant thin film of amorphous carbon-hydrogen-silicon according to the present invention, a possible explanation though not fully made clear, is given below. In the step of depositing the hard and lubricant thin film of amorphous carbon-hydrogen-silicon by plasma-assisted CVD in a specially prepared gas atmosphere for film deposition comprising a gaseous silicon compound and a gaseous carbon compound as the major components, the thin film formation proceeds in a thermal nonequilibrium state that as a result a thin film surface layer of amorphous carbon-hydrogen-silicon having low friction is readily obtained at a low temperature. Further in this step, carbon and silicon are simultaneously deposited that a diamond-like carbon phase can be obtained instead of a graphite phase comprising stably bonded carbon atoms. This is believed to be ascribed to the preference of a 4-coordinate bonding (diamond bonding) of the carbon atom in correspondence with the 4-coordinate bonding of the silicon atom. In this way it is readily realized a hard coating layer having a low friction coefficient on the surface of the object.

Then, the process of the present invention which is suitable for producing the hard and lubricant thin film of amorphous carbon-hydrogen-silicon is explained below.

The process according to the present invention which is suitable for producing the hard and lubricant thin film of amorphous carbon-hydrogen-silicon comprises steps of: placing the object to be coated in the plasma reaction chamber; evacuating the remaining gas from the reaction chamber; introducing a heating gas inside the chamber and simultaneously heating the surface of the object to a predetermined temperature at which the vapor deposition is to be effected; and uniformly depositing on the object and growing thereon a hard thin film of amorphous carbon-hydrogen-silicon, by controlling the inside atmosphere of the reaction chamber to realize a specially prepared gas atmosphere for deposition, ejecting a reactive gas mixture for film deposition from the gas-jet chamber to the reaction chamber and causing discharge therein; the reactive gas mixture comprising a gaseous silicon compound and a gaseous carbon compound in a ratio of flow rate of from 1:5 to 1:50.

The present invention further provides an iron-based metallic material having on the surface thereof a hard thin film coating of amorphous carbon-hydrogen-silicon, and a process for producing the same.

The iron-based metallic material having on the surface thereof a hard thin film coating of amorphous carbon-hydrogen-silicon according to the present invention comprises on the surface thereof a coating layer which is very hard, has an extremely low friction coefficient, and has an excellent adhesion strength to the metallic material.

The present inventors have noticed the role of the carbon atom which is present both in the iron-based metallic material and in the coating layer, and achieved improvement in the adhesion strength of the coating to the metallic material by coating the metallic material with a carbon compound of iron or other metals. This avoids deterioration in adhesion strength of the coating to the metallic material ascribed to the direct contact of the two, since the coating film of a carbon- or silicon carbide-based material is highly reactive with the iron-based metallic material and in a thermal equilibrium state, the both in contact is energetically unstable.

The aforementioned iron-based metallic material having on the surface thereof a hard and lubricant thin film coating of amorphous carbon-hydrogen-silicon according to the present invention is composed of a base of iron or an iron alloy material, a metal-carbon compound layer formed on the surface of the base, and an amorphous thin film based on carbon formed on the surface of the metal-carbon compound layer, wherein the amorphous thin film being such comprising carbon-hydrogen-silicon thin film containing diamond-like carbon, which comprises from 30 to 50% by atomic of hydrogen and the rest comprising 70 % by atomic or more of carbon with the rest comprising a silicon-based material as the major component.

The aforementioned iron-based metallic material according to the present invention comprises on the surface thereof a hard and lubricant coating layer which is very hard, has an extremely low friction coefficient, and has an excellent adhesion strength to the base.

Concerning the mechanism of the effect exhibited by the aforementioned iron-based metallic material according to the present invention, a possible explanation though not fully made clear, is given below.

First of all, there should be recalled the possible mechanism for the deposition of the hard thin film of carbon-hydrogen-silicon having extremely low friction coefficient from the statements set forth above. Furthermore in the iron-based metallic material of the present invention, an additional interlayer of a carbon compound of iron or of another metal is incorporated between the base and the surface thin layer of carbon-hydrogen-silicon by taking advantage of the common constituent, i.e., carbon, to realize a structure wherein direct contact of the surface layer with the iron-based metallic base is avoided. By such a structure is it only possible to combine the base with the thin surface layer of carbon-hydrogen-silicon which is energetically unstable in a thermal equilibrium state. Further advantageous point is that the interlayer has an excellent adhesion strength with both the bgase and the surface layer. This results in a further enhanced adhesibility between the surface layer and the base.

In the iron-based metallic material having on the surface thereof a hard coating layer low in friction coefficient according to the present invention, the base is not particularly restricted as far as it is an iron-based metallic material comprising iron or an iron alloy material, and included therein are those containing carbon, such as carbon steel, alloy steel, cast iron, and sintered alloy. Also included are those very low in carbon content, such as pure iron.

The metal-carbon compound layer incorporated as an interlayer on the surface of the iron-based metallic material base in the material according to the present invention comprises a carbon compound of iron or other metals. This metal-carbon compound layer avoids direct contact of the surface carbon-hydrogen-silicon layer with the base, and at the same time has good adhesion strength with both the base and the surface layer by taking advantage of the anchoring effect of the common component, carbon. Accordingly, there can be used any metal-carbon compound irrespective of the material, structure, and composition, provided that it plays the aforementioned role as the interlayer. There can be mentioned, accordingly, compounds of not only iron, but also vanadium (V), titanium (Ti), chromium (Cr), niobium (Nb), tungsten (W), molybdenum (Mo), and tantalum (Ta). The metal-containing carbon compound layer is incorporated at a thickness which sufficiently avoids direct contact of the surface layer of carbgon-hydrogen-silicon with the underlying base; specifically, it is provided at a thickness of from 0.1 to 10 µm. In the case of incorporating a metal-containing carbon compound layer having a moderate hardness such as that of an iron-containing carbon compound, more preferred is to provide the interlayer at a thickness of from 0.1 to 1 µm. The metal-containing carbon compound layer may additionally contain nitrogen so far as the effect of the interlayer is not impaired.

The carbon-hydrogen-silicon surface thin film layer is a surface layer formed on the surface of the aforementioned metal-carbon compound layer, which is the same as the hard thin film of amorphous carbon-hydrogen-silicon set forth above. The carbon-hydrogen-silicon thin film is characterized by that it is a hard amorphous thin film having an extremely low friction coefficient of 0.05, which comprises carbon and hydrogen as the major components and contains a diamond-like carbon, said amorphous thin film comprising from 30 to 50% by atomic of hydrogen and the rest comprising 70% by atomic or more of carbon with the rest comprising a silicon-based material as the major component.

The iron-based metallic material having on the surface thereof a hard and lubricant coating layer according to the present invention has such a low friction coefficient of 0.05 or less that it can be suitably applied to sliding members where lubricant cannot be applied. Its superiority in hardness also makes it suitable to applications such as tools and metal molds to which conventional hard-facing treatments or coatings had been applied. Furthermore, its excellent corrosion resistance and low reactivity and wettability enables its application to appropriate uses where such properties are required.

Then, a suitable process according to the present invention for producing the iron-based metallic materials having on the surface thereof a hard surface layer low in friction coefficient is described below.

The process according to the present invention which is suitable for producing an iron-based metallic material having on the surface thereof a hard and lubricant layer comprises steps of: coating the object made of an iron material or an iron alloy material with a metal-carbon compound layer; and forming a hard surface layer low in friction coefficient on the resulting object coated with a metal-containing carbon compound by plasma-assisted CVD, said step comprising depositing a thin film of amorphous carbon-hydrogen-silicon by applying discharge to a specially prepared gas atmosphere comprising a mixture of a gaseous silicon compound and a gaseous carbon compound.

The process according to the present invention provides a hard surface layer low in friction coefficient on the surface of the base, said layer is very hard, has an extremely low friction coefficient, and has an excellent adhesibility to the base.

Concerning the mechanism of the effect exhibited by the aforementioned process according to the present invention for producing the iron-based metallic material, a possible explanation though not fully made clear, is given below.

In the process according to the present invention for producing an iron-based metallic material having on the surface thereof a hard layer low in friction coefficient, the iron-based metallic material, which is the object to be treated, is first coated with a metal-carbon compound layer. Such a coating serves as an interlayer avoiding direct contact of the object with the carbon-hydrogen-silicon thin film surface layer since in a thermal equilibrium state the coexistence of both are energetically unstable; yet the interlayer itself has favorable adhesion strength to both and binds them together, taking advantage of the anchoring effect of the carbon contained in both object and the surface layer.

Then, on the resulting object coated with the metal-containing carbon compound layer is formed a hard surface layer low in friction coefficient by plasma-assisted CVD, said step comprising depositing a hard and lubricant thin film of amorphous carbon-hydrogen-silicon by applying discharge to a specially prepared gas atmosphere based on a mixture of a gaseous silicon compound and a gaseous carbon compound. In this step, a thin film of amorphous carbon-hydrogen-silicon low in friction coefficient is readily obtained at a low temperature, since employed here is a plasma-assisted CVD which enables deposition of films under a thermal nonsequilibrium state. Further in this process it is possible to provide diamond-like carbon instead of a graphite phase having a stable carbon bonding, by simultaneously depositing carbon with silicon. This is believed to be ascribed to the preference of a 4-coordinate bonding (diamond bonding) of the carbon atom in correspondence with the 4-coordinate bonding of the silicon atom. In this way it is readily realized a hard coating layer having a low friction coefficient on the surface of the iron-based material with excellent adhesibility, by incorporating therebetween an iron-containing carbon compound layer.

In the process according to the present invention for producing an iron-based metallic material having on the surface thereof a hard and lubricant layer comprises first a step of coating the object made of an iron material or an iron alloy material with a metal-carbon compound layer (i.e. step for forming a metal-carbon compound layer).

The step for forming a metal-carbon compound layer provides an interlayer to be incorporated between the object to be treated and the thin film surface layer of carbon-hydrogen-silicon layer, which has excellent adhesibility to both the object and the overlying thin film surface layer. This interlayer which enhances adhesibility can be formed irrespective of the processes, and specifically mentioned are low-temperature plasma carburization and coating methods for forming metal-carbon compound layers.

Among the processes mentioned above, low-temperature plasma carburization is advantageous in that the process can be carried out in the same plasma reaction chamber which is used in the subsequent step for forming a hard and low friction layer. Furthermore, since this plasma carburization is carried out at a relatively low temperature (ca. 550° C.) as compared with the ordinary plasma carburization (ca. 900° C.) effected with the purpose of forming a carbon-diffusion layer, the layer resulting from this particular plasma carburization is a thin layer composed of an iron carbon compound with most of the carbon still remaining in the surface layer. It should be noted that such a layer formed by plasma carburization at a low temperature is itself not practical, and is not employed in general. More specifically, this plasma carburization process at a low temperature comprises forming a thin iron-containing carbon compound layer on the surface of the object by generating a dc or high frequency plasma under an atmosphere containing a gaseous carbon compound. The cold plasma carburization process is also advantageous in the point that there is no need of supplying an additional metal, since an iron carbon compound is directly formed on the surface of the object by direct bonding of the iron contained in the object with carbon. In short, an interlayer which improves the adhesion strength of the object with the surface layer can be incorporated by supplying only a carbon source.

In the step of depositing a metal-carbon compound layer on the surface of a iron-based metallic surface, processes such as salt bath immersion method, chemical vapor deposition (CVD), physical vapor deposition (PVD), and plasma-assisted CVD can be applied. In the case of applying a plasma-assisted CVD, the same reaction chamber as used in the subsequent step for forming the hard and low-friction surface coating layer can be used. Among the processes mentioned above, plasma-assisted CVD as well as PVD can be carried out at a low temperature. This is an advantageous point, since the subsequent step for forming the hard and low-friction surface coating layer (i.e., the step for forming a thin film of carbon-hydrogen-silicon layer) should be effected at a low temperature, the pretreatment preferably is carried out also at a low temperature.

The next step comprises forming a hard and lubricant thin film of amorphous carbon-hydrogen-silicon as a surface layer on the object formed thereon the metal-carbon compound layer (i.e. step for forming a hard and low-friction surface layer). Specifically, the object coated with the aforementioned metal-carbon compound layer is subjected to a plasma-assisted CVD by applying discharge in a specially prepared atmosphere comprising a gaseous silicon compound and a gaseous carbon compound.

In this step for forming a hard and low-friction surface layer, the object to be coated is first placed on the table provided in the vacuum vessel, and the inside of the vessel is evacuated to remove the remaining gas, to a vacuum of, for example, $1 \times 10^{-4}$ Torr or lower.

Then, under continuous evacuation, heating gas such as hydrogen ($H_2$) is introduced and discharge is effected using, for example, direct current (dc), high frequency, or the like, so that the temperature of the object to be coated be elevated to a predetermined temperature by the plasma energy. Preferably, from the viewpoint of reducing unfavorable impurities such as chlorine (Cl) and to thereby obtain a surface coating having a favorable film quality not deteriorated by impurities, the object to be coated is subjected to high-temperature tempering, wherein the object is heated up to a limit just below the temperature at which the softening of the steel begins.

Discharge is then effected in a specially prepared gas atmosphere for film deposition comprising a gaseous silicon compound and a gaseous carbon compound as the major components, so that an amorphous thin film coating may be deposited and grown on the surface of the object. The specially prepared gas for use in this process comprises an atmospheric gas and a reactive gas. The latter is the starting material for the film. Examples of the atmospheric gas include the commonly used gases such as hydrogen (Hz) and argon (Ar), and examples of the reactive gas include gases of silicon compounds, gases of carbon compounds, and hydrogen. Examples of the gases of silicon compounds include those of silicon tetrachloride ($SiCl_4$), silicon tetrafluoride ($SiF_4$), trichlorosilicon ($SiHCl_3$), and tetramethylsilicon [TMS, $Si(CH_3)_4$]. Examples of the gases of carbon compound include methane ($CH_4$) and other hydrocarbon gases ($C_mH_n$).

The composition of the specially prepared gas for film deposition is properly determined depending to the starting gas, deposition temperature, and other conditions, and the total flow rate of the gas is selected taking balance between the volume of the vacuum vessel and the amount of exhaust gas. A representative gas composition using $SiCl_4$ as the gaseous silicon compound and $CH_4$ as the gaseous carbon compound is, by flow ratio taking the amount of $SiCl_4$ as a unit, from 5 to 50 of $CH_4$, from 50 to 500 of $H_2$, and from 30 to 300 of Ar. In cases wherein decomposition of the gaseous carbon compound is more accelerated by the incorporation of more reactive gaseous carbon compounds such as acetylene ($C_2H_2$), or by the applicatin of a higher deposition temperature or plasma energy, the amount of the gaseous carbon compound relative to that of the gaseous silicon compound can be reduced.

It is preferred in the process according to the present invention to control the pressure of the vacuum vessel in the range of from $10^{-2}$ to 10 Torr. Particularly preferred in the dc discharge process is to control the pressure in the range of from $10^{-1}$ to 10 Torr, and in the high frequency discharge process is preferred to control the pressure in the range of from $10^{-2}$ to 10 Torr. If the pressure is selected from the range out of that aforementioned, the discharge becomes unstable and therefore not preferred.

In the step for forming a hard and low-friction surface layer, a favorable process for forming a hard and lubricant thin film of amorphous carbon-hydrogen-silicon on the surface of the object comprises steps as follows: placing the object to be coated in the plasma reaction chamber; evacuating the remaining gas from the reaction chamber; introducing a heating gas inside the chamber while simultaneously heating the surface of the object to a predetermined temperature at which the vapor deposition is to be effected; and uniformly depositing on the object and effecting growth thereon, a hard thin film of amorphous carbon-hydrogen-cilicon, by controlling the inside atmosphere of the reaction chamber to realize a specially prepared gas atmosphere and simultaneously ejecting a reactive gas mixture for film deposition from the gas-jet chamber to the reaction chamber and causing discharge therein; the reactive gas mixture comprising a gaseous silicon compound and a gaseous carbon compound in a ratio of flow rate of from 1:5 to 1:50.

EXAMPLES

The present invention is described in further detail referring to non-limiting examples.

EXAMPLE 1

Figure 1:
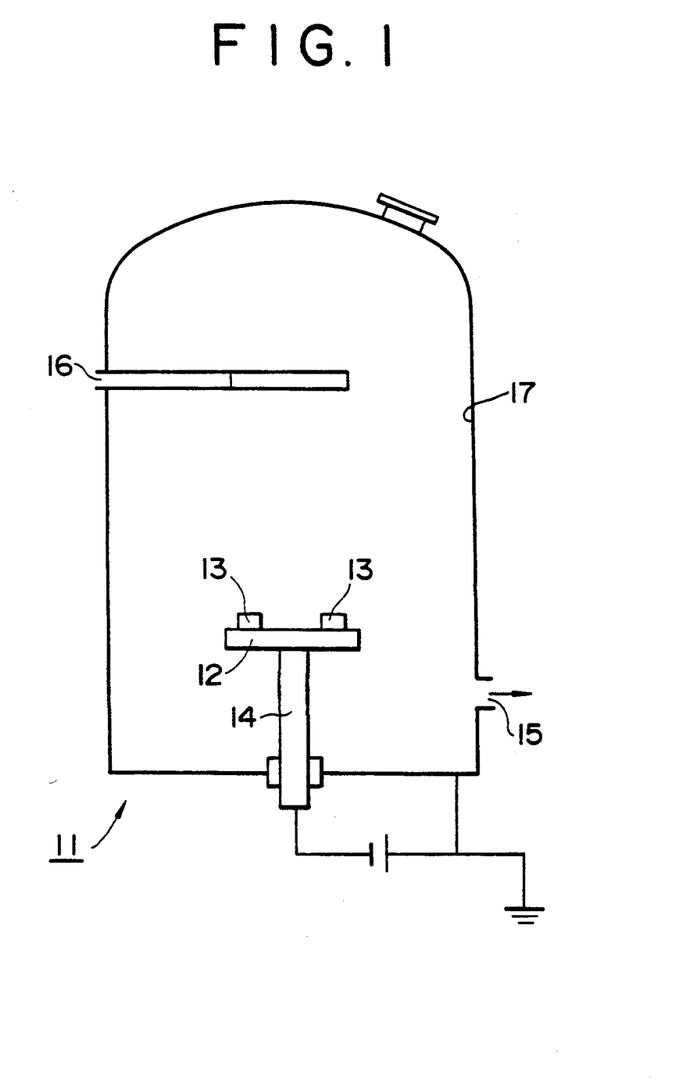
FIG. 1 is a schematic figure of a plasma-assisted chemical vapor deposition (PACVD) apparatus used in the Examples 1 to 6 according to the present invention.

On the surface of a high speed steel material was formed a thin film of amorphous carbon-hydrogen-silicon by plasma-assisted CVD. The resulting material was then subjected to performance evaluation tests. In FIG. 1 is given a schematic figure of the apparatus used for carrying out plasma-assisted CVD on the object material.

First, five disk specimens [13] of a high speed steel (JIS SKH 51, denoted specimen No. 1) each 20 mm in outer diameter and 10 mm in thickness, were mounted on a table [12] provided at the center of a plasma reaction chamber [11] made of a stainless steel. The specimens were arranged in such a way that each were placed in a 60-mm distance from the center of the table [12]. Inside the support [14] of the table [12] is installed a pipe (not shown in the figure) through which a cooling water is passed.

Then, after air-tight sealing the plasma reaction chamber [11], the inside thereof was evacuated through a gas exhaust pipe [15] connected to the vacuum pump, by operating a rotary pump (not shown in the figure) and an oil diffusion pump (not shown in the figure) provided to the vacuum pump, to thereby reduce the remaining gas pressure to $1 \times 10^{-4}$ Torr. The gas inlet is connected with a pipe [16] to gas bombs (not shown in the figure) via control valves (not shown in the figure).

After reducing the inner pressure of the reaction chamber to $1 \times 10^{-4}$ Torr, hydrogen gas was introduced therein as the heating gas, and the pressure inside the reaction chamber [11] was controlled by simultaneous evacuation to maintain the pressure to 1 Torr. At this point was the dc discharge ignited to initiate ion-bombardment, by applying a dc voltage of about 500 to 600 V between a stainless steel made anode plate [17] installed inside the reaction chamber [11] and a cathode (the table) [12], to thereby elevate the surface of the specimens to 550° C. The dc power supply circuit in this process controls the temperature of the specimens to maintain a constant value. This circuit is composed of the anode [17] and the cathode [12], which is power-controlled by the input from the two-color pyrometer (not shown in the figure).

Into the reaction chamber were then introduced gaseous silicon tetrachloride (SiCl$_4$), methane gas (CH$_4$), hydrogen gas (H$_2$), and argon gas (Ar) at the flow rate of 3, 50, 1,000, and 700 ml/minute, respectively, so as to realize therein a specially prepared atmosphere for thin film deposition 4 Torr in total pressure. Under such atmosphere was the chemical vapor deposition carried out by applying dc discharge for 1 hour while maintaining the specimen temperature to 550° C.

Upon completion of the chemical vapor deposition, the discharge was turned off, and the specimens after cooling under a reduced pressure (about $10^{-3}$ Torr) were taken out from the reaction chamber [11] to find black colored layers formed on the surface thereof.

Figure 2:
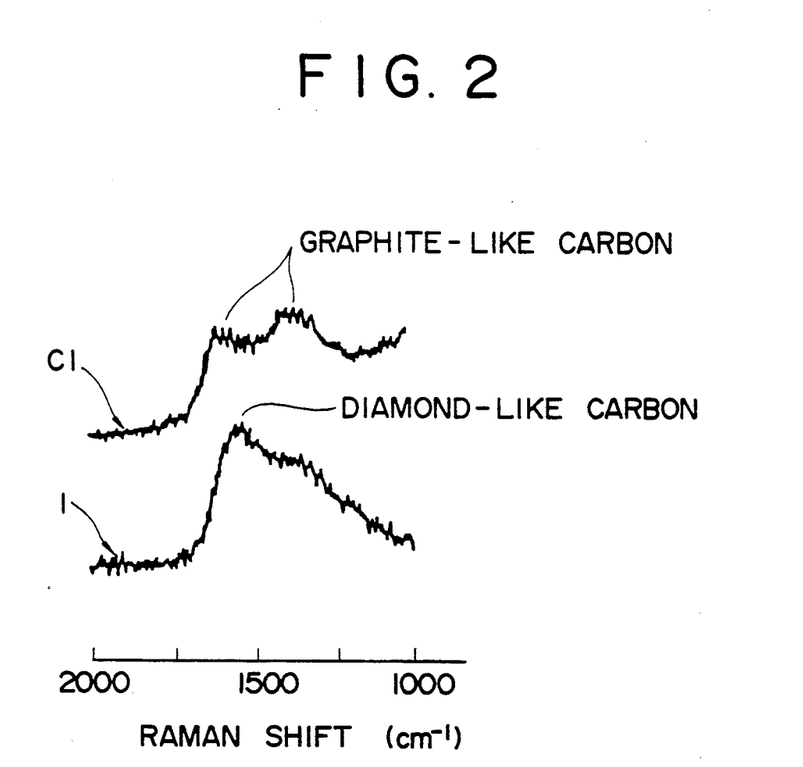
FIG. 2 shows the laser Raman spectra of the thin films obtained in Example 1 according to the present invention and Comparative Example 1.

The black-colored layer of the specimens was then subjected to X-ray diffraction (XRD) for phase identification. No diffraction peaks other than those assigned to the initial specimen were observed in the X-ray pattern, and therefore the black-colored layer was identified to be an amorphous phase. EPMA yielded, with respect to the total composition exclusive of hydrogen, a carbon content of 77% by atomic, with the rest being mainly silicon accompanied by a trace amount of chlorine and the like. Laser Raman spectroscopy gave results as shown in FIG. 2. In the figure, the curve marked with "1" is the spectrum of the specimen used in the present Example. From FIG. 2 it can be seen that a diamond-like carbon is obtained, from the characteristic spectrum having a broad Raman band at around 1550 cm$^{-1}$ accompanied by a shoulder band at around 1400 cm$^{-1}$. Accordingly, the carbon in the coating layer is identified to be mainly present as a diamond-like carbon.

Then, the coating layer was measured for thickness, hardness, and was further subjected to a friction-wear test. The layer thickness was obtained according to a method which comprises observing the cross section of the specimen under an optical microscope, and the surface hardness was measured using a micro-Vicker's hardness tester under a load of 10 gf. The friction-wear test was conducted according to a conventional ball-on-disk testing method, wherein a ball made of a JIS SUJ 2 quench-and-temper material 6 mm in diameter having a hardness, Hv, of about 800 was slid against the test specimen at a sliding velocity of 0.2 m/s for 50 minutes, under a load of 640 gf. The results are given in Table 1.

COMPARATIVE EXAMPLE 1

A plasma-assisted CVD process was carried out in the same manner as in Example 1, except for using gaseous TiCl$_4$ in the place of gaseous SiCl$_4$. A grey-colored surface layer was obtained on the specimens as a result. The grey-colored layer was subjected to phase identification by XRD, EPMA, X-ray photoelectron spectroscopy (XPS), and laser Raman spectroscopy. As a result, the colored layer was identified to be a mixture of a crystalline titanium carbide and an amorphous carbon containing, with respect to total composition exclusive of hydrogen, 80% by atomic of carbon, with titanium mainly constituting the rest. The amorphous carbon phase was identified to be consisting mainly of a graphite-like carbon. In FIG. 2 is given the laser Raman spectrum of the specimen of the present comparative example, which is marked with "C1". In FIG. 2 there can be seen that the "C1" specimen yields a spectrum having broad bands appearing at around 1360 cm$^{-1}$ and 1590 cm$^{-1}$, which are characteristic of graphites low in crystallinity (i.e., a graphite-like carbon). Then, in the same manner as in Example 1, the coating layer was measured for thickness, hardness, and was further subjected to a friction-wear test. The results are shown in Table 1.

TABLE 1

| | Test Results of the Specimens No. 1 and C1 | | | |
|---|---|---|---|---|
| Specimen No. | Layer Thickness (μm) | Hardness (Hv) | Friction Coefficient | Wear depth (μm) |
| 1 | 2 | 2500 | 0.03 | 0.2 |
| C1 | 2 | 500 | 0.85* | —** |

Note:
*Initially the value was about 0.2; but the surface layer wore out in serveral minutes.
**Cohesion occurred on the counter material (SUJ 2 ball).

From Table 1 it can be seen that the specimen No. 1 according to the present invention has a hardness, Hv, of 2500, which is well comparable to a commonly used hard materials such as carbides and nitrides, and yet an extremely low friction coefficient of 0.03.

In contrast to specimen No. 1, the comparative specimen C1 obtained in Comparative Example 1 suffered early consumption of the surface layer by abrasion. This is ascribed to the low hardness, since no sufficient hard carbon is formed. In this case, therefore, the friction coefficient increased and induced cohesion on the counter material. The low hardness, i.e., an Hv of 500, of the specimen C1 is in good agreement with that of a graphite-like carbon, and the initial friction coefficient of 0.2 also agrees well with the generally accepted friction coefficient of a graphite-like carbon. In conclusion, it can be said that in a coating layer containing amorphous carbon, the tribological properties of the layer such as hardness and friction properties are mostly determined by the bonding state, i.e., the structure, of the carbon.

EXAMPLE 2

Figure 3:
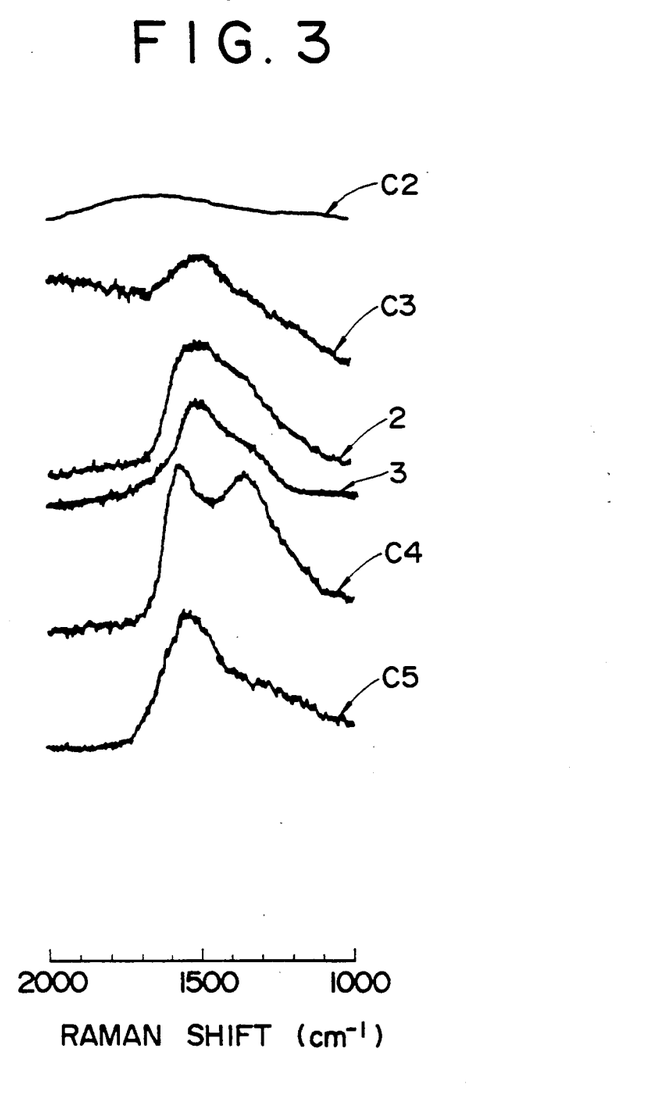
FIG. 3 shows the laser Raman spectra of the thin films obtained in Examples 2 and 3 according to the present invention and in Comparative Examples 2 to 5.

A plasma-assisted CVD process was carried out in the same manner as in Example 1, except for changing the flow rate for the gaseous SiCl$_4$ to 5 ml/minute and that for the CH$_4$ gas to 80 ml/minute. A black-colored surface layer was obtained on the specimens (denoted specimen No. 2) as a result. The black-colored layer was subjected to phase identification by XRD as in Example 1, to observe no other XRD peaks other than those assigned to the initial specimen, and therefore the black-colored layer was identified to be an amorphous phase. EPMA gave, with respect to total composition exclusive of hydrogen, approximately 80% by atomic of carbon, with silicon mainly constituting the rest accompanied by a trace amount of chlorine and the like. The amorphous carbon phase was also identified by laser Raman spectroscopy to be consisting mainly of a diamond-like carbon. In FIG. 3 is given the laser Raman spectrum of the specimen of the present Example, which is marked with "2". Then, in the same manner as in Example 1, the coating layer was measured for thickness, hardness, and was further subjected to a friction-wear test. The results are shown in Table 2.

EXAMPLE 3

A plasma-assisted CVD process was effected on a cold-processed die steel, to thereby deposit a thin film of amorphous carbon-hydrogen silicon on the surface thereof. The resulting coating layer was subjected to performance evaluation tests.

First, a cold-processed die steel (JIS SKD 11; specimen No. 3) was used for the specimen, which was subjected to the same plasma-assisted CVD as in Example 2, except for introducing 7 ml/minute of trichlorosilicon ($SiHCl_3$) as the gaseous silicon compound and 100 ml/minute of acetylene ($C_2H_2$) gas as the gaseous carbon compound, while controlling the deposition temperature to 500° C. and taking the deposition duration for 0.5 hours. A black-colored surface coating layer was obtained on the specimen as a result.

The black-colored layer was subjected to phase identification by XRD, to observe no other XRD peaks other than those assigned to the initial specimen, and therefore the black-colored layer was identified to be an amorphous phase. EPMA gave, with respect to total composition exclusive of hydrogen, approximately 85% by atomic of carbon, with silicon mainly constituting the rest accompanied by a trace amount of chlorine and the like. The amorphous carbon phase was also identified by laser Raman spectroscopy to be consisting mainly of a diamond-like carbon. In FIG. 3 is given the laser Raman spectrum of the specimen of the present Example, which is marked with "3". Then, in the same manner as in Example 1, the coating layer was measured for thickness, hardness, and was further subjected to a friction-wear test. The results are shown together in Table 2.

COMPARATIVE EXAMPLES 2 TO 7

A plasma-assisted CVD process was carried out in the same manner as in Example 2, except for changing the flow rate of the $CH_4$ gas to 30 and 40 ml/minute each in Comparative Example 2 and 3, respectively, to obtain specimens C2 and C3. A brown-colored surface layer was obtained on the specimen C2 and a dark brown-colored surface layer on the specimen C3 as a result. The brown- and dark brown-colored layer were each subjected to phase identification by XRD, EPMA, and laser Raman spectroscopy to confirm formation of layers containing amorphous silicon carbide as the main constituent. Each of the samples C2 and C3 gave an EPMA result, with respect to total composition exclusive of hydrogen, of 60% and 68% by atomic of carbon, respectively. Each of the specimens was also identified by laser Raman spectroscopy, and it was confirmed on specimen C3 that some diamond-like carbon was present. In FIG. 3 are given the laser Raman spectra of the specimens of the Comparative Examples 2 and 3, which are marked with "C2" and "C3", respectively. Then, in the same manner as in Example 1, the coating layer was measured for thickness, hardness, and was further subjected to a friction-wear test. The results are shown in Table 2.

A plasma-assisted CVD process was carried out in the same manner as in Example 2, except for increasing the flow rate of the $CH_4$ gas to 150 ml/minute. A slightly blunt black-colored surface layer was obtained on the specimens (specimen C4) as a result. The black-colored layer was subjected to performance evaluation tests as above, to obtain a composition with respect to total composition exclusive of hydrogen, of 92% by atomic of carbon, with silicon mainly constituting the rest accompanied by a trace amount of chlorine and the like. The coating layer was also identified by laser Raman spectroscopy to confirm that it contained a graphite-like carbon. In FIG. 3 is given the laser Raman spectrum of the specimen of the present Example, which is marked with "C4". Then, in the same manner as above, the coating layer was measured for thickness, hardness, and subjected to a friction-wear test. The results are shown in Table 2.

Further as Comparative Examples were prepared a diamond-like carbon coating by ion-plating (Comparative Example 5, specimen C5); a titanium nitride coating by plasma-assisted CVD (Comparative Example 6, specimen C6); and a non-treated specimen (Comparative Example 7, specimen C7). Then, in the same manner as above, the coating layer was measured for thickness, hardness, and subjected to a friction-wear test. The results are shown together in Table 2.

TABLE 2

| | Test Results for the Specimens | | | |
|---|---|---|---|---|
| Specimen No. | Layer Thickness ($\mu m$) | Hardness (Hv) | Friction Coefficient | Wear depth ($\mu m$) |
| 2 | 2.5 | 2300 | 0.03 | 0.2 |
| 3 | 3 | 2000 | 0.04 | 0.3 |
| C2 | 2.5 | 2300 | 0.43 | 2.0 |
| C3 | 3 | 2200 | 0.09 | 0.4 |
| C4 | 3 | 1800 | 0.12 | 0.4 |
| C5 | 2 | 5000 | 0.15 | 0.2 |
| C6 | 2 | 2000 | 0.58 | 1.8 |
| C7 | — | 800 | 0.92 | —* |

Note: *Cohesion occurred on the counter material (SUJ 2 ball).

From Table 2 it can be seen that the specimens 2 and 3 obtained in Examples 2 and 3 according to the present invention comprise hard thin film coatings having an Hv in the range of from 2,000 to 2,300, well comparable to those of the commonly used hard nitrides and carbides, while extremely low friction coefficient in the range of from 0.03 to 0.04 is obtained with small wear depth.

In Comparative Example 2 (specimen C2) on the other hand, it can be seen that despite the hardness well comparable to those of specimens 2 and 3, the coating is mainly amorphous silicon carbide low in carbon content and comprises little diamond-like carbon component, and so exhibits high friction coefficient accompanied by increased wear depth. A friction coefficient of 0.43 is a relatively high value comparable to that of a sintered SiC ceramic. In Comparative Example 3 (specimen C3), the friction coefficient abruptly decreases from that of C2 with increasing amount of carbon content ascribed to formation of a diamond-like carbon from the excess amount of carbon. In this specimen C3, however, the amount of excess carbon is still insufficient, and therefore the friction coefficient and the wear depth are still a little high and yield 0.09 and 0.4 $\mu m$, respectively. Further in Comparative Example 4 (specimen C4), although the carbon content with respect to total composition exclusive of hydrogen is as high as 92% by atomic, they appear to be present as a graphite-like carbon phase as observed by laser Raman spectroscopy. However, there is a possibility that diamond-like carbon may be present in a small amount considering that the sensitivity (Raman scattering efficiency) of laser Raman spectroscopy on graphite is 60 times as large as that on diamond. The presence of a diamond-like carbon phase is expected from the results given in Table 2, since C4 yields a relatively high hardness and relatively fair friction properties, though not so excellent as those of the Examples. In Comparative Example 5 (specimen C5) yielding a diamond-like carbon coating, a high hardness, Hv, of 5,000 is obtained, however, the friction coefficient is also as high as 0.15 and the wear loss of the counter material was an order of magnitude higher than those of the specimens 2 and 3. The titanium carbide coating of Comparative Example 6 (specimen C6) gives a lower friction coefficient if compared with that of a non-treated specimen (C7) of Comparative Example 7. But this friction coefficient is about 15 times as high as those of specimens 2 and 3. Furthermore, the wear depth also yielded a high value 7 times as large as that of the aforementioned specimens 2 and 3.

It can be seen from the results above that the surface coating layer obtained in Examples 2 and 3 according to the present invention provide a considerably improved wear resistance as compared with that of the coating materials presently employed in the art.

Further comparing specimens 1 to 3 obtained in the Examples according to the present invention, it can be seen that the friction coefficients vary in the range of from 0.03 to 0.04. This variation within 30% directly corresponds to the difference in frictional force. Accordingly, friction wear and damage in the sliding member is sensitive to the aforementioned difference in the friction coefficient so far as the same friction-wear mode is applied. More specifically, as clearly read from Tables 1 and 2, the wear depths vary from one specimen to another and the wear loss of the counter material differs, in correspondence to the little difference in friction coefficient. It is therefore preferred that an amorphous thin film coating having a lowest possible friction coefficient is used as the sliding member. From the foregoing discussion, it can be seen that the amorphous thin film coatings obtained in Examples 1 to 3 according to the present invention give a low friction coefficient in the range of from 0.03 to 0.04, and that are therefore far effective than C5 to C7, yielding friction coefficient in the range of from 0.15 to 0.92, still effective than C3 yielding a friction coefficient of 0.09. It should be noted therefore, that the amorphous thin films obtained in Examples 1 and 2 with friction coefficient of 0.03 are particularly excellent in wear resistance.

Figure 4A:
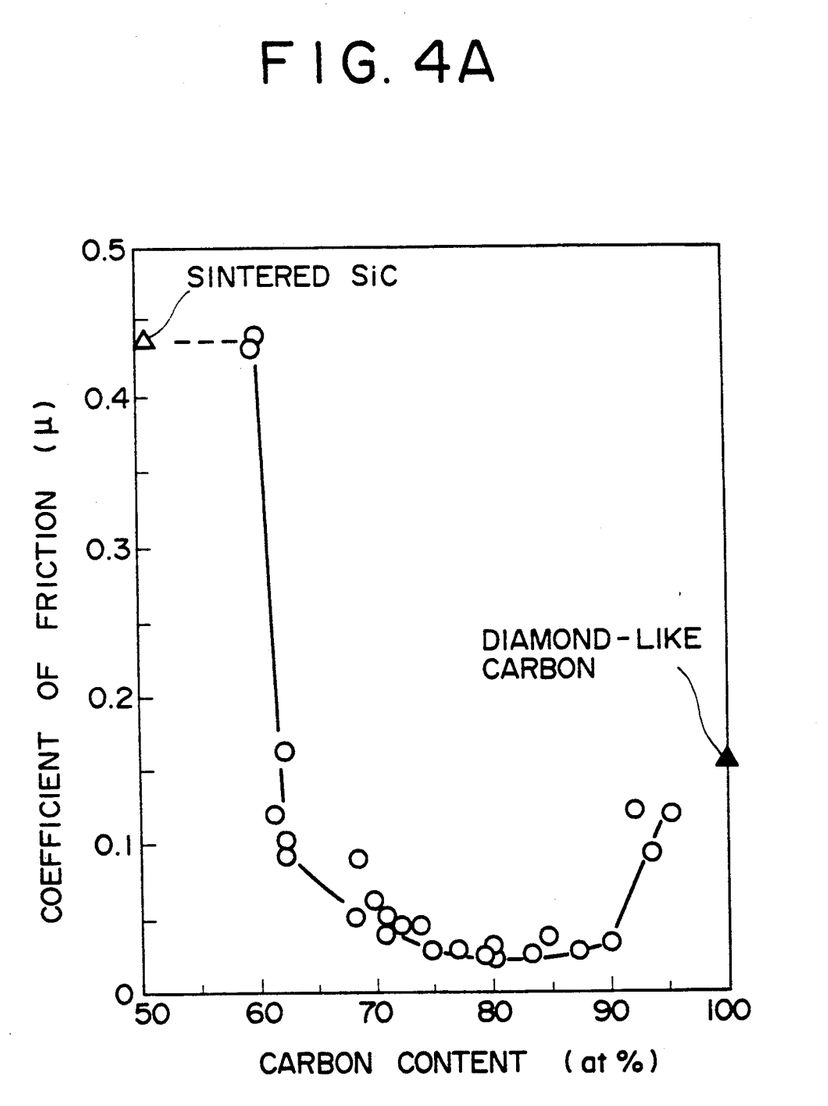
FIG. 4A shows the relationship between the friction coefficient of the thin films obtained in Examples 1 to 3 according to the present invention and those obtained in Comparative Examples 2 to 5, to the carbon content of the thin film excluding hydrogen.

In FIG. 4A are shown the friction coefficient of the specimens 1 to 3 obtained in Examples according to the present invention and of the specimens C2 to C5 obtained in Comparative Examples, versus the carbon content as expressed by % by atomic with respect to total composition exclusive of hydrogen content. Together in the figure are plotted values for the thin film coatings obtained in the same manner as in Example 1, except for varying the flow rates of gaseous silicon tetrachloride (SiCl$_4$), methane (CH$_4$), hydrogen (H$_2$), and argon (Ar). The plotted values are given in terms of mean value obtained on 3 specimens.

Figure 4B:
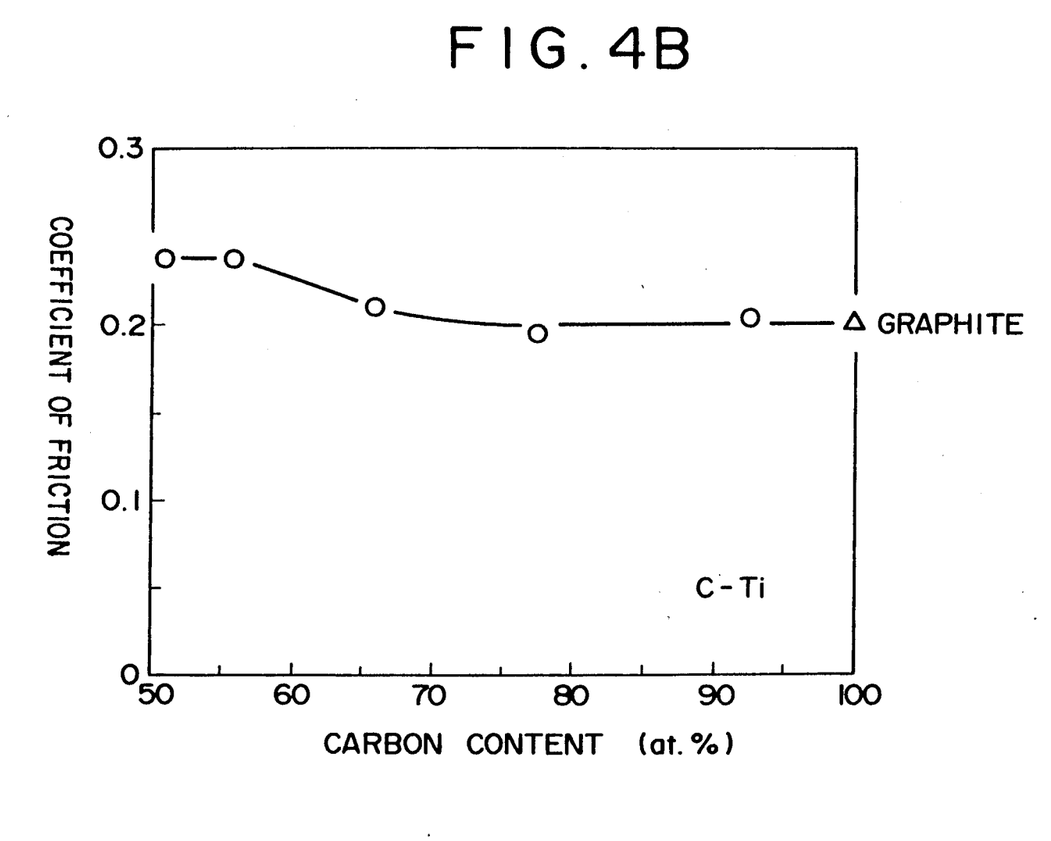
FIG. 4B shows the relationship between the friction coefficient of the thin films obtained in Comparative Example 1 and those obtained with carbon-hydrogen-titanium, and the carbon content of the thin film excluding hydrogen.

In FIG. 4B are plotted, as a comparison to above, values of friction coefficient against carbon content of specimens obtained in thin film coatings of carbon-hydrogen-titanium, inclusive of that obtained in Comparative Example 1. From FIG. 4B it can be read that a constant value of 0.2 is obtained as the friction coefficient over the carbon content range studied, and in contrast to the case of coatings containing silicon, no phenomenon of decreasing the value was observed. From those results, it can be seen that addition of silicon and the compositional control of the coating play the essential role in obtaining a coating of low friction coefficient.

In addition, similar examinations were conducted using another element having the same diamond structure as silicon, i.e., germanium, but again no improvement in the friction coefficient could be obtained.

EXAMPLE 4

A plasma-assisted CVD process was carried out in the same manner as in Example 1, except for using TMS [Si(CH$_3$)$_4$] as the gaseous silicon compound. A black-colored surface layer was obtained on the specimens (specimen No. 4) as a result. The black-colored layer was subjected to performance evaluation tests as in Example 1, to obtain a composition with respect to total composition except hydrogen, of 83% by atomic diamond-like carbon, accompanied by silicon but free from chlorine. The hydrogen content of the coated material was obtained by combustion method to give approximately 40% by atomic of hydrogen. The coating layer was also identified by laser Raman spectroscopy, and the Raman spectrum thus obtained is given in FIG. 5, which is marked with "4". Then, in the same manner as above, the coating layer was subjected to performance evaluation tests, which results are shown in Table 3.

COMPARATIVE EXAMPLE 8

Figure 5:
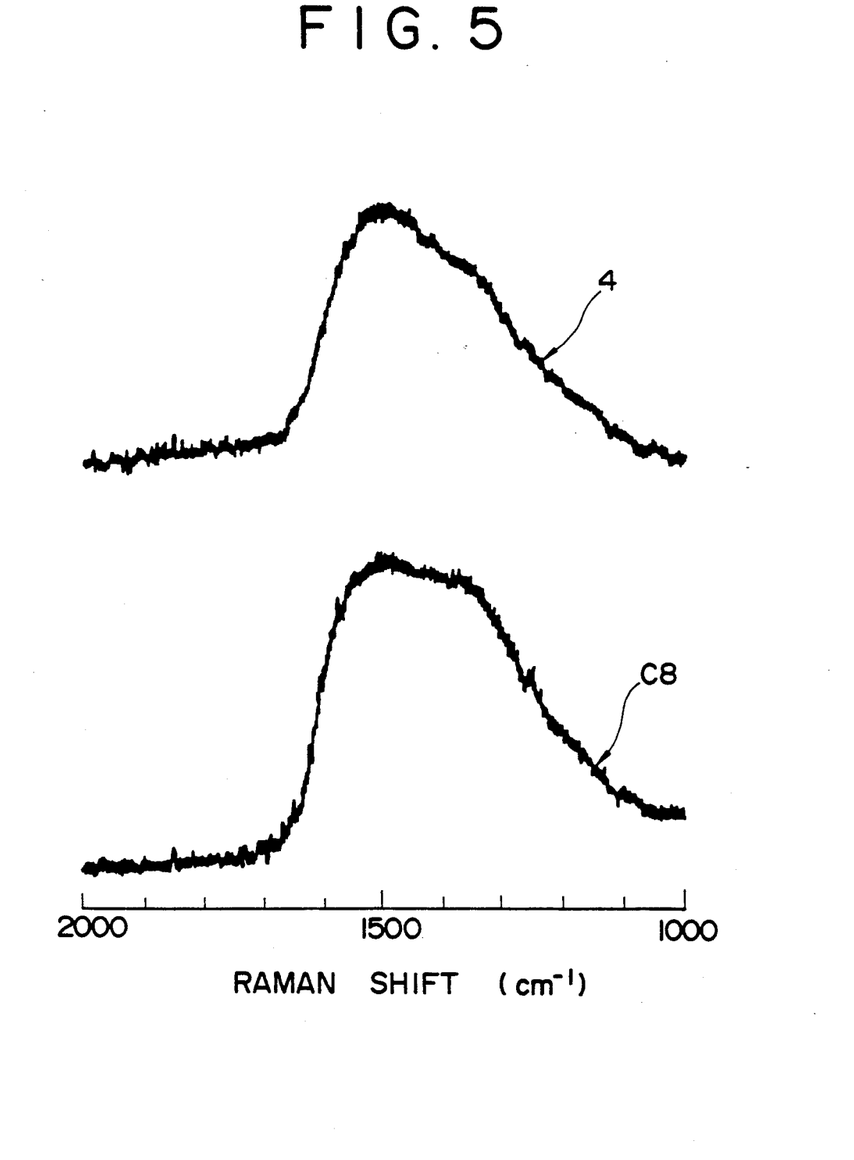
FIG. 5 shows the laser Raman spectra of the thin films obtained in Example 4 according to the present invention and in Comparative Example 8.

An amorphous thin film prepared in the same manner as in Example 4 was heated at 600° C. for 1 hour under a vacuum of $1 \times 10^{-6}$ Torr, to thereby obtain a comparative thin film devoid of hydrogen (specimen C8). On this comparative specimen were conducted performance evaluation tests in the same manner as in Example 1. In FIG. 5 is given the laser Raman spectrum of the sample, marked with "C8", and in Table 3 are given results obtained in the performance evaluation tests.

TABLE 3

| | Test Results of the Specimens No. 4 and C8 | | | |
|---|---|---|---|---|
| Specimen No. | Layer Thickness (μm) | Hardness (Hv) | Friction Coefficient | Wear depth (μm) |
| 4 | 2 | 2400 | 0.04 | 0.3 |
| C8 | 2 | 2000 | 0.11 | 0.4 |

From FIG. 5 it is clear that the carbon maintains a diamond-like carbon structure even after being heated, though is slightly altered by the release of hydrogen. But from Table 3 it can be seen that the friction coefficient is increased to a high 0.11 by loss of hydrogen. Wear depth also is increased. This signifies that a silicon-containing diamond-like carbon structure alone can not lower the friction coefficient to 0.05 or lower, and that the hydrogen contained in the structure plays an important role in achieving a low friction coefficient.

EXAMPLE 5

On a high speed steel material were successively formed an iron carbon compound coating layer and a thin film surface layer of amorphous carbon-hydrogen-silicon, by plasma-assisted carburization and plasma-assisted CVD, respectively. The set up of the apparatus used for plasma-assisted CVD is shown in FIG. 1.

First, five disk specimens [13] of a high speed steel (JIS SKH 51, denoted specimen No. 5) each 20 mm in outer diameter and 10 mm in thickness, were mounted on a table [12] provided at the center of a plasma reaction chamber [11] made of a stainless steel. The specimens were arranged in such a way that each were placed in a 60-mm distance from the center of the table [12]. Inside the support [14] of the table [12] is installed a pipe (not shown in the figure) through which a cooling water is passed.

Then, after air-tight sealing the plasma reaction chamber [11], the inside thereof was evacuated through a gas exhaust pipe [15] connected to the vacuum pump, by operating a rotary pump (not shown in the figure) and an oil diffusion pump (not shown in the figure) provided to the vacuum pump, to thereby reduce the remaining gas pressure to $1 \times 10^{-4}$ Torr. The gas inlet is connected with a pipe [16] to gas bombs (not shown in the figure) via control valves (not shown in the figure).

After reducing the inner pressure of the reaction chamber to $1 \times 10^{-4}$ Torr, hydrogen gas was introduced therein as the heating gas, and the pressure inside the reaction chamber [11] was controlled by simultaneous evacuation to maintain the pressure to 1 Torr. At this point was the dc discharge ignited to initiate ion-bombardment, by applying a dc voltage of about 500 to 600 V between a stainless steel made anode plate [17] installed inside the reaction chamber [11] and a cathode (the table) [12], to thereby elevate the surface of the specimens to 550° C. The dc power supply circuit in this process controls the temperature of the specimens to maintain a constant value. This circuit is composed of the anode [17] and the cathode [12], which is power-controlled by the input from the two-color pyrometer (not shown in the figure).

Into the reaction chamber were then introduced methane gas ($CH_4$) as the carburizing gas, together with hydrogen gas ($H_2$) and argon gas (Ar) at the flow rate of 50, 750, and 500 ml/minute, respectively, so as to realize therein a specially prepared atmosphere for thin film deposition 4 Torr in total pressure. Under such atmosphere was the plasma-assisted carburization carried out by continuously applying dc discharge for 6 hours while maintaining the specimen temperature to 550° C.

Then, while continuously applying the dc discharge, 3 ml/minute flow of silicon tetrachloride ($SiCl_4$) was introduced provided that the total pressure was maintained at 4 Torr, to thereby realize a specially prepared atmosphere. Under such a controlled atmosphere, the dc discharge was continuously applied while maintaining the temperature at 550° C., to effect the chemical vapor deposition.

Upon completion of the chemical vapor deposition, the discharge was turned off, and the specimens after cooling under a reduced pressure (about $10^{-3}$ Torr) were taken out from the reaction chamber [11] to find black colored layers formed on the surface thereof.

Then, a cold-processed die steel (JIS SKD 11; denoted specimen No. 6) was used for the specimen, which was subjected to the same plasma-assisted carburization and plasma-assisted CVD as above, except for introducing 5 ml/minute of trichlorosilicon ($SiHCl_3$) as the gaseous silicon compound and 40 ml/minute of acetylene ($C_2H_2$) gas as the gaseous carbon compound, while controlling both the carburization and deposition temperatures to 500° C. and taking the deposition duration for 0.5 hours. A black-colored surface coating layer was obtained on the specimen as a result.

The black-colored layer of the specimens was then subjected to X-ray diffraction (XRD) for phase identification. No diffraction peaks other than those assigned to the initial specimen were observed in the X-ray pattern, and therefore the black-colored layer was identified to be an amorphous phase. EPMA yielded, with respect to the total composition exclusive of hydrogen, a carbon content of 79% by atomic (specimen 5) and 72% by atomic (specimen 6), with the rest being mainly silicon accompanied by a trace amount of chlorine and the like for both specimens. Laser Raman spectra show that diamond-like carbon phases are obtained for both specimens, from the characteristic spectrum having a broad Raman band at around 1550 $cm^{-1}$ accompanied by a shoulder band at around 1400 $cm^{-1}$. Accordingly, the carbon in the coating layer is identified to be mainly present as a diamond-like carbon. Furthermore, elemental analysis of the specimens was conducted along the depth direction using Auger Electron Spectroscopy (AES), to observe formation of an interlayer 0.2 $\mu$m in thickness, composed of an iron-containing carbon compound.

Then, the coating layer was measured for thickness, hardness, and was further subjected to a friction-wear test. The layer thickness was obtained according to a method which comprises observing the cross section of the specimen under an optical microscope, and the surface hardness was measured using a micro-Vicker's hardness tester under a load of 10 gf. The friction-wear test was conducted according to a conventional ball-on-disk testing method, wherein a ball made of a JIS SUJ 2 quench-and-temper material 6 mm in diameter having a hardness, Hv, of about 800 was slid against the test specimen at a sliding velocity of 0.2 m/s for 50 minutes, under a load of 640 gf. The results are given in Table 4.

A plasma-assisted carburization process and a plasma-assisted CVD process were carried out in the same manner as in the Example above, except for changing the flow rate of the $CH_4$ gas to 20 ml/minute to obtain specimens C9. A brown-colored surface layer was obtained as a result on the specimen C9. The brown-colored layer was subjected to phase identification by XRD, then to EPMA, and laser Raman spectroscopy to confirm formation of a surface layer containing amorphous silicon carbide as the main constituent, which comprises, with respect to total composition exclusive of hydrogen, of 55% by atomic of carbon. Then, in the same manner as above, the coating layer was measured for thickness, hardness, and was further subjected to a friction-wear test. The results are given in Table 4.

Further as Comparative Examples were prepared a diamond-like carbon coating by ion-plating (specimen C10); a titanium nitride coating by plasma-assisted CVD (specimen C11); and a non-treated specimen (specimen C12). Then, in the same manner as above, the coating layer was measured for thickness, hardness, and subjected to a friction-wear test. The results are given together in Table 4.

TABLE 4

| | Test Results for the Specimens | | | |
|---|---|---|---|---|
| Specimen No. | Layer Thickness ($\mu$m) | Hardness (Hv) | Friction Coefficient | Wear loss * |
| 5 | 2 | 2500 | 0.04 | $3.1 \times 10^{-10}$ |
| 6 | 2.5 | 2000 | 0.05 | $4.0 \times 10^{-10}$ |
| C9 | 2 | 2500 | 0.12 | $9.5 \times 10^{-10}$ |
| C10 | 3 | 5000 | 0.15 | $1.6 \times 10^{-9}$ |
| C11 | 2 | 2000 | 0.58 | $7.0 \times 10^{-8}$ |
| C12 | — | 800 | 0.92 | $1.5 \times 10^{-7}$ |

Note: *Wear loss of the counter material, in ($mm^3$/kgf · mm).

From Table 4 it can be seen that the specimens 5 and 6 obtained in the Example according to the present invention comprise hard thin film coatings having an Hv in the range of from 2,000 to 2,500, well comparable to those of commonly used hard carbides and nitride. Moreover, extremely low friction coefficients in the range of from 0.04 to 0.05 are obtained on the specimens, yielding very small wear loss on the counter material. In the comparative specimen C9, on the other hand, it can be seen that despite the hardness well comparable to those of the specimens of the invention, the coating is low in carbon content and thereby the friction coefficient is increased, and causes much damage (wear loss) on the counter material. In comparative specimen C10 having a diamond-like carbon coating, a high hardness, Hv, of 5,000 is obtained, however, the friction coefficient is also as high as 0.15 and the wear loss of the counter material is an order of magnitude higher than those of the specimens according to the present invention. The titanium carbide coating of comparative specimen C11 gives a lower friction coefficient and wear loss of the counter material as compared with those of a non-treated specimen (C12). But this friction coefficient is about 15 times as high as those of the specimens according to the present invention. Furthermore, the wear loss of the counter material is extremely high, as high as about 230 times those of the aforementioned specimens 5 and 6.

It can be seen from the results above that the surface coating layer obtained in the examples according to the present invention provide a considerably improved wear resistance as compared with that of the coating materials presently employed in the art.

EXAMPLE 6

The same plasma-assisted processes as in Example 5 to obtain specimen 5 were carried out, except for changing the conditions as given in Table 5. A black-colored surface layer was obtained on the specimens (denoted specimen No. 7 and 8) as a result. The black-colored layer was subjected to phase identification by XRD as in Example 5, to observe no other XRD peaks other than those assigned to the initial specimen, and therefore the black-colored layer was identified to be an amorphous phase. EPMA gave, with respect to total composition exclusive of hydrogen, 78% by atomic of carbon for specimen 7 and 72% by atomic of carbon for specimen 8. The amorphous carbon phase was also identified by laser Raman spectroscopy to reveal that it is mainly composed of a diamond-like carbon. Then, in the same manner as in Example 5, the coating layer was measured for thickness, hardness, and subjected to a friction-wear test. The results are given together in Table 6.

For comparison, a plasma-assisted CVD process was carried out in the same manner as above, except for incorporating an interlayer of a metal-carbon compound layer. As a result, a specimen coated with a black-colored layer was obtained (specimen C13). This black-colored layer was subjected to phase identification by XRD, and was further subjected to EPMA and laser Raman spectroscopy, to confirm formation of a thin film coating of a hydrogen-containing thin film layer similar to those formed on specimens 7 and 8, which contains, with respect to total composition exclusive of hydrogen, 78% by atomic of carbon. The layer thickness and surface hardness were measured in the same manner as above, and friction-wear test was conducted also in the same manner as above, except for changing the applied load to 4600 gf. The results are given together in Table 6.

TABLE 5

| | Process conditions | | | |
|---|---|---|---|---|
| Specimen No. | Interlayer/ thickness (μm) | SiCl₄ flow rate (ml/min) | CH₄ flow rate (ml/min) | Duration (hours) |
| 7 | Fe-contg. C-cpd. 0.2 | 5 | 80 | 1 |
| 8 | V-carbide 1.0 | 7 | 100 | 1 |
| C13 | none | 5 | 80 | 1 |

TABLE 6

| | Test Results for the Specimens | | | |
|---|---|---|---|---|
| Specimen No. | Layer Thickness (μm) | Hardness (Hv) | Friction Coefficient | Wear loss** |
| 7 | 3 | 2500 | 0.04 | 3.5 × 10⁻¹⁰ |
| 8 | 4 | 2300 | 0.05 | 3.7 × 10⁻¹⁰ |
| C13 | 3 | 2500 | 0.85* | 1.0 × 10⁻⁷ |

Note:
*Initial value was 0.04, but peeled off several minutes after the beginning of the test.
**Wear loss of the counter material, in (mm³/kgf · mm).

From Table 6 it can be seen that the specimens 7 and 8 according to the present invention comprise hard thin film coatings having an Hv in the range of from 2,300 to 2,500, well comparable to those of commonly used hard carbides and nitrides. Moreover, extremely low friction coefficients in the range of from 0.04 to 0.05 are obtained on the specimens, yielding very small wear loss on the counter material. In the comparative specimen C13, on the other hand, it can be seen that the coating layer suffer low adhesion strength not capable to withstand the friction applied under high load, and therefore resulting in falling off from the base after short time. Thus, the low initial friction coefficient of this specimen well comparable to those of specimens 7 and 8, abruptly increased with the generation of the spalling of the coating layer and as a result caused much wear loss on the counter material.

While the invention has been described in detail and with reference to specific embodiments thereof, it will be apparent to one skilled in the art that various changes and modifications can be made therein without departing from the spirit thereof.

What is claimed is:

1. A hard and lubricating thin film of amorphous carbon-hydrogen-silicon, which consists essentially of: carbon, hydrogen and silicon, wherein the content of said hydrogen is from 30 to 50 atomic % and the content of said carbon is from 70 to 90 atomic % with respect to the total composition except said hydrogen, and the thin film contains diamond-like carbon, and is from 0.5 μm to 10 μm in thickness.

2. The hard thin film according to claim 1, wherein said diamond-like carbon is a substance yielding a broad band at around 1550 cm⁻¹ and a shoulder band at around 1400 cm⁻¹ when detected by laser Raman spectroscopy.

3. An iron-based metallic material having on the surface thereof a hard and low-friction layer, which consists essentially of:
    a substrate of iron or an iron alloy material;
    a metal-carbon compound layer formed on the surface of the substrate; and
    a hard thin film of a thickness of from 0.5 μm to 10 μm of amorphous carbon-hydrogen-silicon formed on the metal-carbon compound layer, said thin film consisting essentially of from 30 to 50 atomic % of hydrogen, from 70 to 90 atomic % of carbon, with the balance silicon, and the thin film containing diamond-like carbon.

4. The iron-based metallic material according to claim 3, wherein said metal-carbon compound contains at least one metal selected from the group consisting of iron (Fe), vanadium (V), titanium (Ti), chromium (Cr), niobium (Nb), tungsten (W), molybdenum (Mo), and tantalum (Ta).

* * * * *